(12) United States Patent
Smith et al.

(10) Patent No.: US 8,206,674 B2
(45) Date of Patent: Jun. 26, 2012

(54) BORON NITRIDE NANOTUBES

(75) Inventors: Michael W. Smith, Newport News, VA (US); Kevin Jordan, Newport News, VA (US); Cheol Park, Yorktown, VA (US)

(73) Assignees: National Institute of Aerospace Associates, Hampton, VA (US); The United States of America as represented by the Administration of NASA, Washington, DC (US)

( * ) Notice: Subject to any disclaimer, the term of this patent is extended or adjusted under 35 U.S.C. 154(b) by 699 days.

(21) Appl. No.: 12/152,414

(22) Filed: May 14, 2008

(65) Prior Publication Data
US 2009/0117021 A1 May 7, 2009

Related U.S. Application Data

(60) Provisional application No. 60/930,206, filed on May 15, 2007.

(51) Int. Cl.
*C01B 21/064* (2006.01)
*B01J 19/12* (2006.01)
(52) U.S. Cl. .................................. 423/290; 204/157.4

(58) Field of Classification Search ....................... None
See application file for complete search history.

(56) References Cited

OTHER PUBLICATIONS

Goldberg et al.; Nanotubes in Boron Nitride Laser Heated at High Pressure; Appl. Phy. Lett.; 69 (14), 2045-2047; 1996.*
Lee et al.; Catalyst-Free synthesis of boron Nitride Single-Wall Nanotubes with a Preferred Zig-Zag Configuration; Physical review B, vol. 64, 121405; 2001.*

* cited by examiner

*Primary Examiner* — Melvin Mayes
*Assistant Examiner* — Guinever Gregorio
(74) *Attorney, Agent, or Firm* — George F. Helfrich; Kimberly A. Chasteen; Helen M. Galus

(57) ABSTRACT

Boron nitride nanotubes are prepared by a process which includes:
(a) creating a source of boron vapor;
(b) mixing the boron vapor with nitrogen gas so that a mixture of boron vapor and nitrogen gas is present at a nucleation site, which is a surface, the nitrogen gas being provided at a pressure elevated above atmospheric, e.g., from greater than about 2 atmospheres up to about 250 atmospheres; and
(c) harvesting boron nitride nanotubes, which are formed at the nucleation site.

24 Claims, 5 Drawing Sheets

BORON NITRIDE NANOTUBES

CROSS REFERENCE TO RELATED APPLICATION

This Application claims the benefit of U.S. Provisional Application No. 60/930,206 filed on May 15, 2007 for "Boron Nitride Nanotubes".

STATEMENT REGARDING FEDERALLY SPONSORED RESEARCH OR DEVELOPMENT

The U.S. Government has a paid-up license in this invention and the right in limited circumstances to require the patent owner to license others on reasonable terms as provided for by the terms of Cooperative Agreement No. NCC-1-02043 awarded by the National Aeronautics and Space Administration and Management and Operating Contract DE-AC05-06OR23177 from the United States Department of Energy.

BACKGROUND OF THE INVENTION

1. Field of the Invention

This invention relates generally to the production of nanostructures. It relates particularly to the formation of at least centimeter-long stranded boron nitride nanotube fibers.

2. Description of the Related Art

Since the announcement of the successful synthesis of high-aspect-ratio few-walled boron nitride nanotubes (FW-BNNTs) in 1995, little progress has been made in the scale-up of their synthesis. As a demonstration, in spite of the theoretical capabilities of FW-BNNTs to provide high strength-to-weight, high temperature resistance, piezo-electric actuation, and radiation shielding (via the boron content), the aerospace industry still relies on micron-sized graphite or boron fibers for structural applications. Neither FW-BNNTs nor single-wall carbon nanotubes are widely used in aerospace manufacturing, the industry generally most willing to pay a premium for high performance.

To date, high-aspect ratio FW-BNNTs have been produced in small amounts (from individual tubes to milligrams) by arc-discharge or laser heating methods. A separate class of boron nitride nanotubes has also been produced by chemical vapor deposition of nitrogen compounds (e.g. ammonia) over ball-milled precursors, but these tubes are of larger diameter and do not exhibit the continuous crystalline sp2-type bonding structure which has drawn most theoretical interest.

BRIEF SUMMARY OF THE INVENTION

It is a primary object of the present invention to provide what is not available in the art, viz., a synthetic process which provides a significant advancement in anticipation of kilogram-scale production of boron nitride nanotubes—a most important steppingstone toward the investigation of their properties in macroscopic practice and their ultimate commercial use.

This primary object and its attending benefits are achieved by providing a process for producing boron nitride nanotubes and nanostructures, which includes the following sequential procedural steps:
(a) providing a boron-containing target in a chamber under nitrogen pressure which is elevated above atmospheric; and
(b) thermally exciting the boron-containing target.

Especially advantageous results are obtained if the boron-containing target is thermally excited by means of a laser, such as a free electron laser or a carbon dioxide laser.

Beneficial results are obtained if the boron-containing target is made of compressed boron powder or compressed boron nitride powder.

The target is advantageously cylindrical, rotating, and illuminated on the radius, or cylindrical, rotating, and illuminated on one face. However, the target may also be stationary.

Highly desirable and very advantageous results are obtained if the process includes the following sequential procedural steps:
(a) creating a source of boron vapor;
(b) mixing the boron vapor with nitrogen gas so that a mixture of boron vapor and nitrogen gas is present at a nucleation site, the nitrogen gas being provided at a pressure which is greater than about 2 atmospheres but less than about 250 atmospheres; and
(c) harvesting boron nitride nanotubes, which are formed at the nucleation site, advantageously in the absence of a catalyst.

The source of boron vapor is advantageously provided by supplying energy to a solid boron-containing target, such energy being sufficient to break bonds in the solid boron-containing target, thereby allowing boron vapor to enter the vapor state.

This energy is preferably focused thermal energy. This energy is conveniently and advantageously in the form of a laser beam which is directed at the solid boron-containing target. Exemplary lasers employed to supply such a laser beam beneficially include a free electron laser and a carbon dioxide laser, among others known to the skilled artisan.

Excellent results have been obtained when the solid boron-containing target is a plug or block of pressed boron powder or pressed boron nitride powder. Moreover, it has been found to be advantageous and convenient if the laser beam, which is directed at the solid boron-containing target, is allowed to drill a hole in the solid boron-containing target as the laser beam is directed thereto, thereby creating a stream of boron vapor by laser heating inside the hole. This stream of boron vapor is allowed to flow upwardly from the bottom of the hole and through the hole, after which it contacts the nitrogen gas. The nitrogen gas is advantageously kept under pressure in a synthesis chamber which encloses the solid boron-containing target and contains the nitrogen gas under pressure.

Although nitrogen gas may be advantageously employed at a pressure greater than about 2 atmospheres but less than about 250 atmospheres, very excellent results are achieved if nitrogen gas is provided at a pressure from greater than about 2 atmospheres up to about 12 atmospheres.

Boron nitride nanotubes are formed according to the present invention at a nucleation site, in the absence of a catalyst or in the presence of a catalyst. The nucleation site is advantageously a surface, especially a surface having an asperity. It has been found to be very beneficial if the nucleation site is the upper periphery of the hole in the solid boron-containing target, where any asperity exists. This hole in the solid boron-containing target was discussed hereinabove in paragraph [010]. Boron nitride nanotubes are formed at this nucleation site and propagate away therefrom in the direction of flow of the stream of boron vapor, which stream has been created by laser heating within the hole.

After they are formed, the boron nitride nanotubes are harvested, advantageously continuously, by standard means known to the skilled artisan. As an example of such continuous harvesting, a growth rate of about 10 cm/sec for the boron nanotubes has been achieved by the present process.

By the present process, boron nitride nanotubes are produced which are crystalline nanotubes having continuous, parallel, substantially defect-free and sp2 bonded walls. These nanotubes are single-walled nanotubes, double-walled nanotubes, few-walled nanotubes, and multi-walled nanotubes.

BRIEF DESCRIPTION OF THE SEVERAL VIEWS OF THE DRAWINGS

For a more complete understanding of the present invention, including its primary object and attending benefits, reference should be made to the Detailed Description of the Invention, which is set forth below. This Detailed Description should be read in the light of the accompanying Drawings, wherein:

FIG. 2A presents raw streamer material, a network of boron nitride nanotubes and round nanoparticles; the scale bar is 200 nm; boron nitride target. FIG. 2B presents scanning transmission mode (STEM) images of the same material as in FIG. 2A; the scale bar is 20 nm; the inset of FIG. 2B shows individual boron nitride nanotubes growing from a boron nitride-encapsulated boron nanoparticle; the inset scale bar is 10 nm. FIG. 2C presents an image of streamer raw material; the target is boron metal; scale bar is 200 nm. FIG. 2D presents an STEM image of a long boron nitride nanotube bundle on a holey carbon grid (indicated by arrows on the inset); the inset scale bar is 500 nm, and the main image scale bar is 20 nm; the main image shows a closeup of aligned bundles.

FIG. 3A shows smooth, few-walled, crystalline boron nitride nanotubes; scale bar in the main image is 5 nm; scale bar in the inset is 5 nm. FIG. 3C presents a zero-loss image of boron nitride nanotube bundles and boron nitride encapsulated boron nanoparticles; the scale bar is 50 nm. FIGS. 3D and 3E present energy filtered transmission electron microscopy (EFTEM) boron and nitrogen elemental maps of the same region presented in FIG. 3C.

DETAILED DESCRIPTION OF THE INVENTION

Our primary contribution is that under elevated ambient pressure (e.g., ~12 bar (1.2 MPa)), and with the appropriate feedstock, few-walled boron nitride nanotube (FW-BNNT) fibers will grow continuously by surface nucleation from seemingly arbitrary asperities at a high linear rate (many cms per second). We call these fibers "streamers" because they appear to follow the streamlines of the vapor flow in a synthesis chamber, flapping in a motion reminiscent of a kite tail.

Figure 1A:
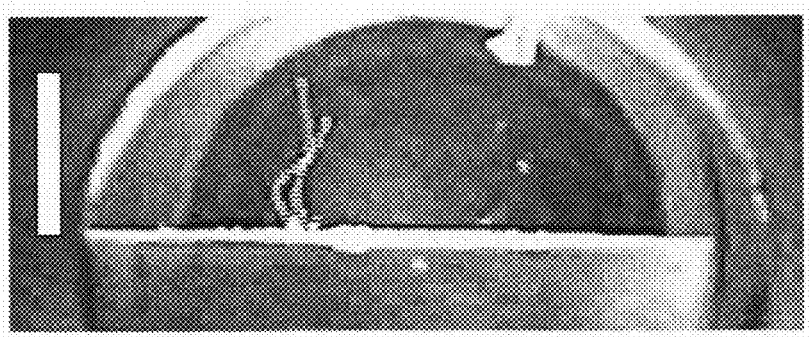
FIGS. 1A-1C are drawings made from still images taken from a video showing the formation of streamers of boron nitride nanotubes prepared according to the present invention.
Figure 1B:
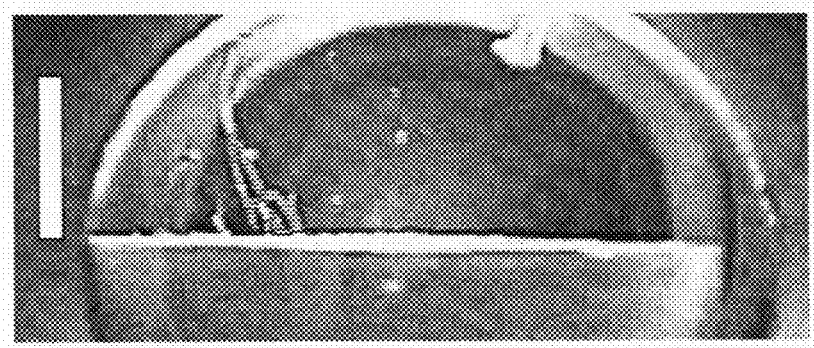
Figure 1C:
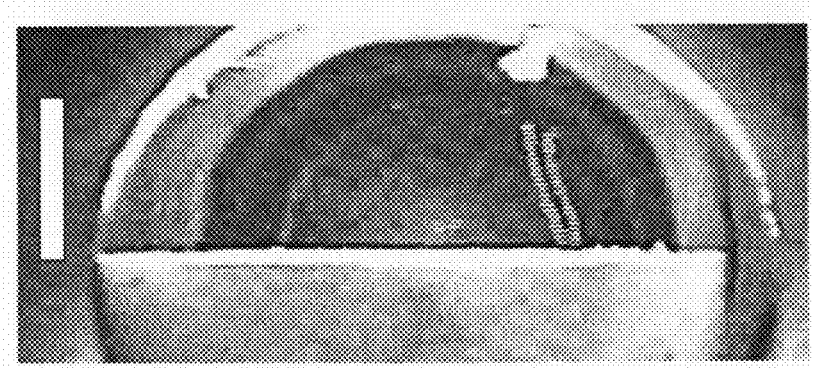
Figure 1D:
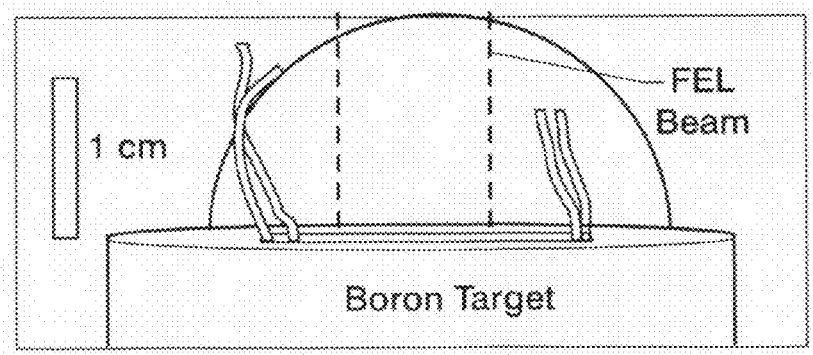
FIG. 1D is a schematic showing the relationship of a boron-containing target to a free electron laser (FEL) beam, according to one embodiment of the present invention; this figure also shows outlines of streamers of boron nitride nanotubes prepared according to the present invention. Scale bars are 1 centimeter in all figures.

In FIGS. 1A-1C still frames from a video clip display three separate instances of streamer formation. The laser beam, a 1.6 micron wavelength, 8 mm diameter, unfocused, 1 kW, beam from a FEL (free electron laser), propagates vertically downward into the target. The target, a 2.5 cm diameter plug of pressed boron metal powder rotates on a turntable at 20 sec/revolution. The center of rotation of the target is offset by about a half beam diameter from the center of the beam, so that the laser drills a hole about twice its diameter as the target spins. An ambient temperature nitrogen gas is fed into the synthesis chamber continuously.

At the periphery of the laser-drilled hole streamers form and are elongated by the upward flow of boron vapor. The flapping motion occurs as the fibers follow the streamlines of the turbulent boron vapor flow. The boron vapor is created by laser heating at the bottom of the hole, which at this point is about 2 cm deep. Streamers form quickly, reaching over a centimeter in length within about $\frac{1}{30}^{th}$ of a second. Sections of streamers snap off and swirl above the target before being carried from the chamber by a low-speed flow of nitrogen gas. The chamber pressure for this clip is approximately 12 bar. Other elevated ambient pressures find application, and are being currently investigated. Other lasers, as well as other heating methods, also find application, and are also being currently investigated. Elevated chamber pressure is indeed critical to the formation of streamers. When the nitrogen pressure was reduced from 12 bar to slightly above 1 bar (near atmospheric), no streamers were seen, and instead, a shower of sparks was ejected from the laser illumination zone. In post-run analysis, the sparks appeared to be droplets of boron metal that had solidified after ejection from the laser zone, and came to rest in the bottom of the chamber. An odor of boron vapor was present when the synthesis chamber was opened, indicating a lack of reaction with nitrogen.

Streamers were collected both from the target face and downstream on collector surfaces (wire coils). When held by its ends, a streamer felt like a piece of spider silk, and was similar thereto in appearance, medium matte grey in color. It could be plucked like a guitar string to two or three times its length and then returned to its original shape.

Figure 2A:
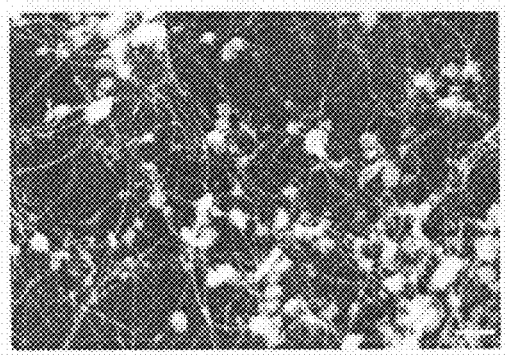
FIGS. 2A-2D are drawings made from high resolution scanning electron microscope (HRSEM) images.
Figure 2B:
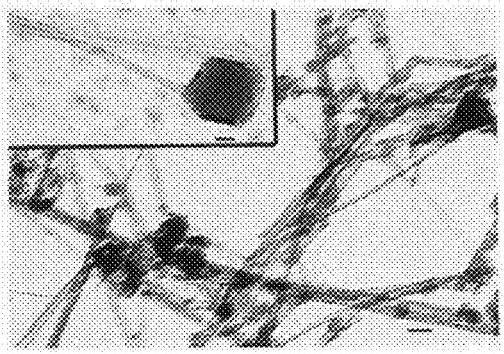
Figure 2C:
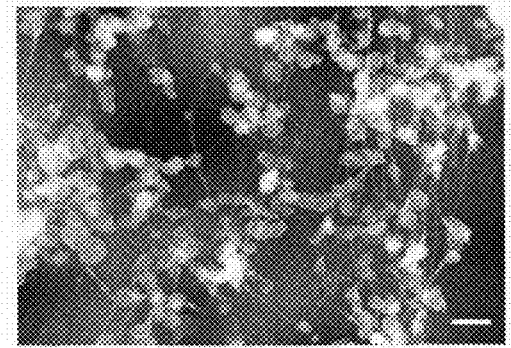

This behavior is explained in FIGS. 2A and 2C. These are HRSEMs (high resolution scanning electron microscope images) of streamers formed by both boron metal and boron nitride targets under similar conditions. They show that the streamers are composed of a network of BNNT bundle strands that can deform under load then spring back to their original shape. Also visible in the HRSEMs are numerous globular nanoparticles ranging from 5 to 80 nm in diameter. FIG. 2B is a closer view of the network under scanning transmission mode (STEM) with an inset highlighting a single droplet. This droplet appears to have a crystalline coating and a single BNNT, about 3 nm in diameter, issuing from one vertex.

Figure 2D:

FIG. 2D shows an isolated long bundle of BNNTs; these could readily be found to be as long as 30 microns. The main image shows that this bundle was composed of aligned sub-bundles of BNNTs and the inset shows an approximately 10 micron long section (indicated by the arrows) deposited on a holey carbon grid.

Figure 3A:
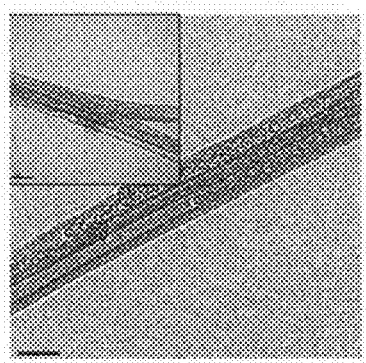
FIGS. 3A, 3C, 3D and 3E are drawings made from high resolution transmission electron microscopy (HRTEM) images.
Figure 3C:
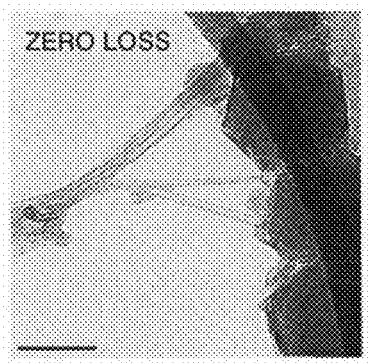
Figure 3B:
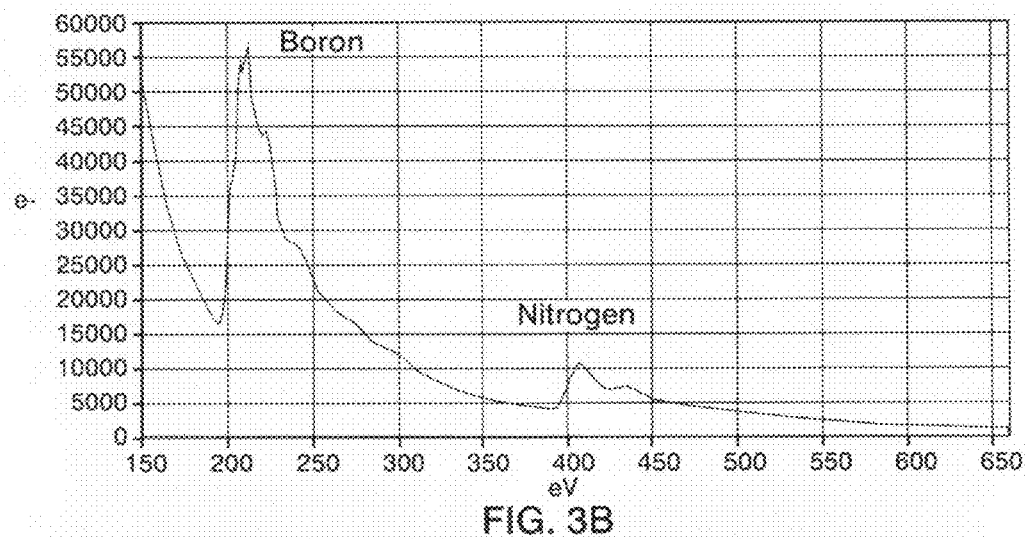
FIG. 3B depicts electron energy loss spectroscopy (EELS) spectra of boron nitride nanotubes according to the present invention.

Transmission electron microscopy (TEM) showed some single-walled BNNTs and many double-walled BNNTs, though the most common form was about 3-5 nm in diameter with 2-5 walls (FIG. 3A and its inset). The walls were smooth and continuous, indicating good crystallinity. Electron energy loss spectroscopy (EELS) in FIG. 3B showed distinct peaks of the boron and nitrogen K-edges at 188 and 401 eV, respectively, indicating that the tubes contained hexagonal boron nitride (h-BN) bonding. The B-to-N ratios from various EELS spectra were approximately 1:1, the correct ratio for sp-2 bonded BNNTs.

Figure 3D:
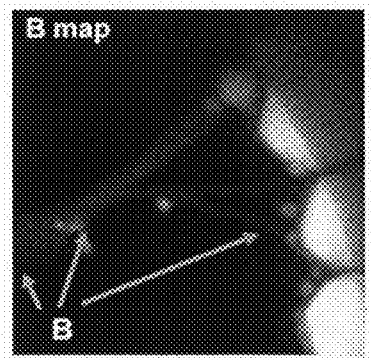
Figure 3E:
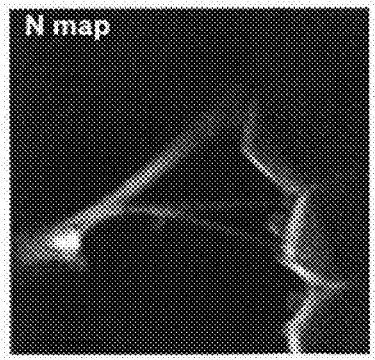
Figure 4:
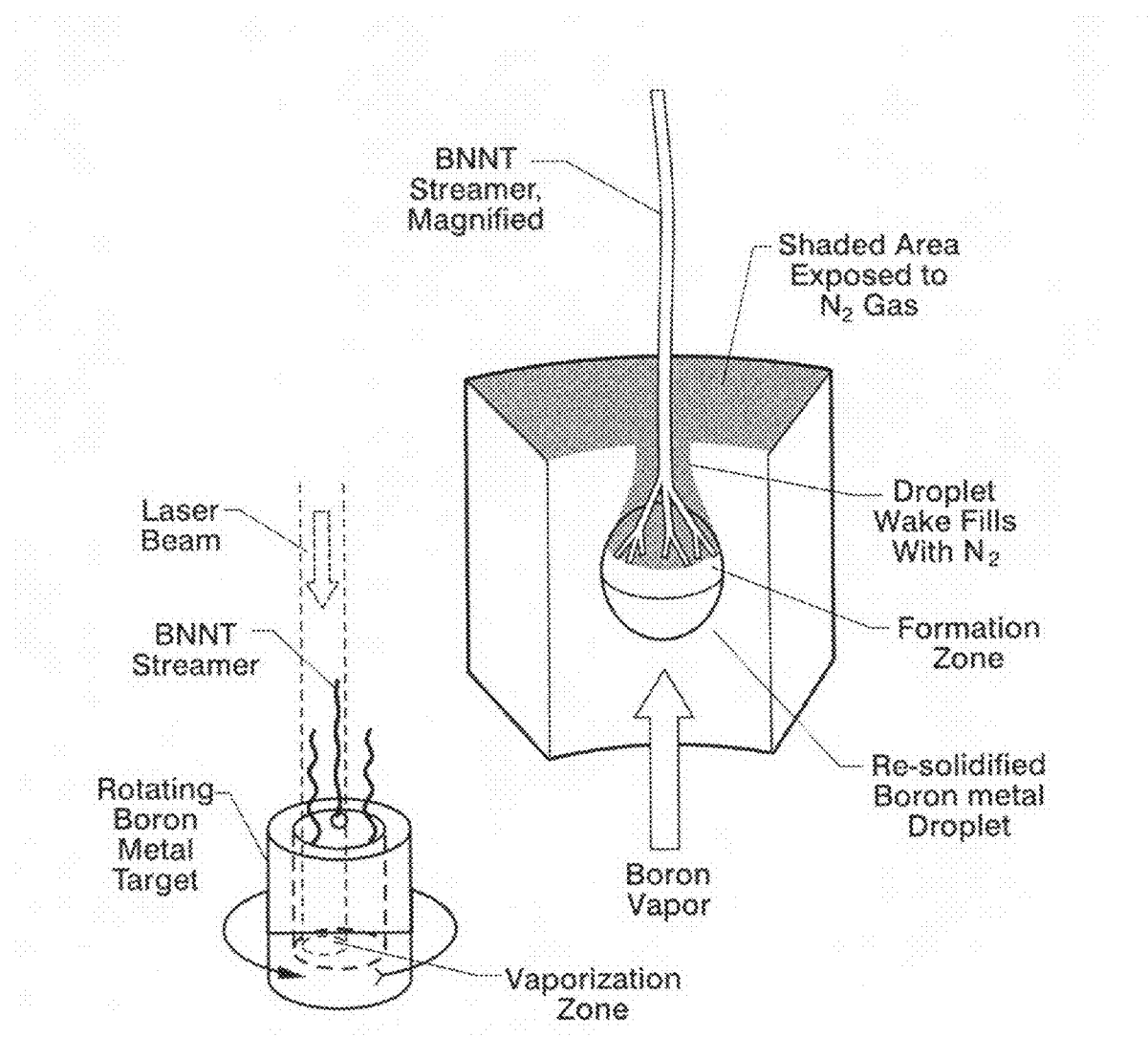
FIG. 4, in the main figure and in the inset, presents schematically a proposed model of few-walled boron nitride nanotube growth in a boron/nitrogen mixing zone in the wake of a solidified boron droplet.

Elemental map images created with energy filtered transmission electron microscopy (EFTEM) confirmed that the nanotubes were BN, but also showed that the nanoparticles were composed of boron metal, coated with a layer of crystalline BN. FIG. 3C shows a TEM zero energy loss image of streamer raw material, on lacey silicon film. Elemental maps were obtained for this area using a standard three-window technique. The boron and nitrogen maps are shown in FIGS. 3D and 3E. The BNNTs exhibit medium grey levels in both images, consistent with the expected B and N content. The nanoparticles, however, appear with bright cores on the B map and bright coatings on the N map, indicating solid boron droplets with BN growth on the surface. FIG. 4 is a model of our conclusion concerning how the streamers form on the macroscale. There is an initial transient process to arrive at the situation depicted in the lower left of the figure. For 30 seconds or so after the laser first strikes the target surface no streamers are seen, just a dark cloud of ejected material. During this period the laser is removing boron metal by ablation, drilling a cavity deep into the target. As the hole gets deeper (~2 cm), the natural tapering of the walls slows the drilling process. After a total illumination time of about a minute, the hole becomes a radiant cavity, allowing the temperature to rise to the boiling point of boron. On a video, shadow graphic waves (like the ripples in the air above a hot roadway) appear above the target, indicating the mixing of hot rising boron vapor with cold nitrogen gas in the synthesis chamber. When this condition is reached, streamers start to form near the lip of the cavity and the situation depicted in the lower left of FIG. 4 is presented.

At this point, a significant upward flow of boron vapor is established. Based on post-run analysis of the target, the streamers appear to form according to the aerodynamic mechanism depicted in the right side of FIG. 4. On the inner rim of the target, a number of solidified boron metal droplets, microns to millimeters in diameter, formed. Streamers were preferentially attached to the downstream (upper) side of these droplets. These are regions where nitrogen gas could penetrate up the aerodynamic wake of the droplets and form a mixing zone of boron and nitrogen vapors, the feedstock required for BNNT growth.

At the base of each long streamer, many shorter individual BNNT feeder roots were seen. It was concluded that these short roots tangled together after growing a few millimeters from the wall, due to the turbulent forces of the boron vapor flow. The main streamers grew to the centimeter length scale, fed by the fast mutual growth of their feeder roots. Examination under optical and SEM microscopes showed that individual roots were attached to a variety of asperities on the surface: grain boundaries in the solidified boron metal, micron-sized droplets on the surface, and white particles of apparent BN crystals.

Figure 5:
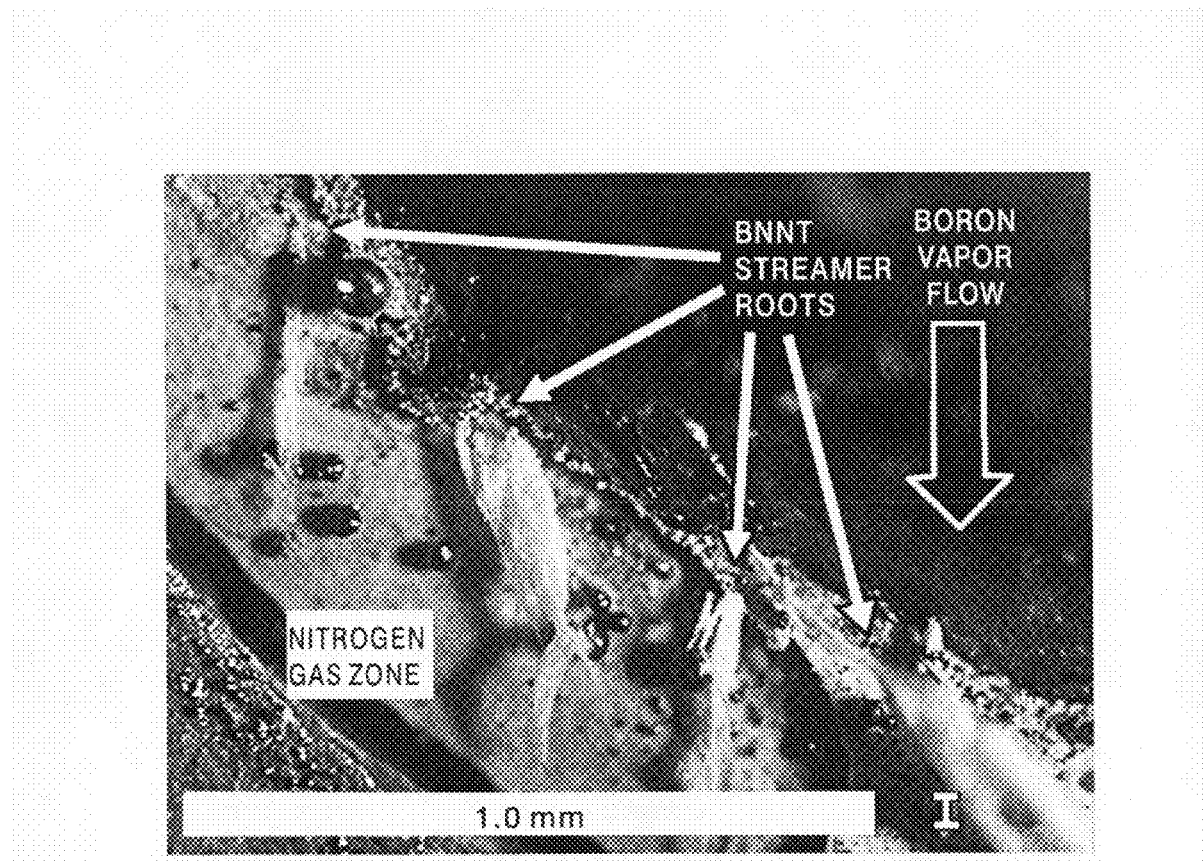
FIG. 5 is a drawing made from an optical microscope image depicting four aligned millimeter-scale streamers of boron nitride nanotube fibers near the lip of the boron-containing target; boron vapor has flowed downwardly from the top of the image over the ridge of solidified metal, where mixing with nitrogen caused these millimeter-scale few-walled boron nitride nanotube structures to form.

Because the centimeter-long fibers fell into a tangle after the laser was shutdown, it was not possible to photograph full-length streamers in their extended condition. However, several streamers in the early stages of BNNT growth (feeder roots) were seen along the periphery of the target and photographed with an optical microscope. FIG. 5 shows four aligned, millimeter-scale streamers attached to a delaminated layer of re-solidified metal. The layer has separated from the target surface to provide an aerodynamic step, creating the mixing zone of boron vapor and nitrogen necessary to feed the root growth of the fibers.

Based on these observations, our conclusion is that unlike the formation of carbon nanotubes, boron nitride nanotubes do not require a chemically catalytic surface for nucleation. They will simply form spontaneously and continuously by root growth on any suitable surface, e.g., an asperity in a zone where hot boron vapor and cold nitrogen gas mix to the correct stoichiometry. And, under the elevated pressure employed, the growth rate can be many centimeters per second in a localized fiber.

Because we had previously made single-walled carbon nanotubes (SWCNTs) with the free electron laser (FEL) described hereinabove, we began our synthesis work on BNNTs using the same laser conditions and process. For SWCNTs the graphite target contained metal catalysts which were vaporized by the ultrafast pulses of the FEL into a cloud of nanometer scale nucleation sites. The same catalyst combinations (Ni, Co, Fe) and some refractories (W, Nb) were used with B and BN targets to try to stimulate BNNT growth at atmospheric nitrogen pressure, but only boron, not boron nitride nanostructures, were found. Only when deep cavities were drilled by the laser to create flows of boron vapor, and the nitrogen pressure was elevated, did we see the formation of BN streamer fibers. This positive result was achieved with both hot pressed hexagonal-BN powder targets and cold pressed powdered-metal boron targets, and never with added metals.

A word should be said about the possible role of boron metal droplets in the nucleation of BNNT streamers. Clearly boron droplets are found in the structure of the streamer material (FIGS. 2A, 2B and 3C) and it appears that nanotubes can grow from them (FIG. 2B, inset). However, because the streamers remain attached to the surface by their roots during growth (and after the laser is turned off), it is concluded that their primary growth mechanism is surface nucleation on fixed irregularities. If the primary growth mechanism were nucleation by a cloud of boron droplets, BNNT streamers would not attach to the surface, just to the droplets (as we see with laser-oven produced carbon nanotubes). It should be no surprise, however, that boron droplets are a common occurrence, as the boron vapor stream cools rapidly as it exits the target cavity.

Based on our conclusion, BNNT production is fundamentally less complicated than carbon nanotube (CNT) production where a gas-borne cloud or coated surface of catalytic particles must be produced and kept active during the growth process. We have already demonstrated that this process is readily continuous for centimeters of fiber. If it can be extended to meters, then BNNT growth may simply be limited by the ability to produce a steady supply of boron vapor and to provide an appropriate mixing and nucleation zone.

It is important to note that the laser, under our hypothesis, is only one means of heating powdered boron metal to create boron vapor. The heating zone and BNNT formation zone are physically separated. Although the laser-drilling mechanism that formed the cavities in this implementation may be unique to the FEL beam properties, the technique is applicable with other lasers and other sources of heat given an appropriate geometry. There are, of course, substantial engineering obstacles, as the boiling point of boron, for example, at 12 bar is high (3250 C). This temperature is readily accessible to laser and arc heating, but laser heating is inherently expensive and arc heating difficult to control and fraught with contamination. It remains to be seen if RF induction heating, hydrogen-oxygen flame, or another source, can provide a more practical route to clean, continuous boron vaporization.

Since laser heating has been demonstrated here, however, let us assess, to an order of magnitude, the next step that could be pursued with readily available lasers. With the 1 kW FEL, boron target weight loss was about 35 g/hour. For a commercially available 10 kW $CO_2$ welding/cutting laser, then, one would estimate a boron vapor flow of 350 g/hour. If even 50% of the boron flow could be converted to streamers through surface nucleation, a kilogram of raw material could be produced in just a few hours. Such an advance in scale-up is required for the potential of bulk boron nitride nanotube fibers to be fully realized.

We claim:

1. A process for producing boron nitride nanotubes and nanostructures, which process comprises thermally exciting a boron-containing target in a chamber under nitrogen pressure which is elevated above 2 atmospheres and less than 250 atmospheres.

2. The process of claim 1, wherein the boron-containing target is thermally excited by means of a laser.

3. The process of claim 2, wherein the laser is a member selected from the group consisting of a free electron laser and a carbon dioxide laser.

4. The process of claim 1, wherein the boron-containing target comprises a member selected from the group consisting of compressed boron powder and compressed boron nitride powder.

5. The process of claim 4, wherein the target is cylindrical, rotating, and illuminated on the radius.

6. The process of claim 4, wherein the target is cylindrical, rotating, and illuminated on one face.

7. The process of claim 4, wherein the target is stationary.

8. A process for producing boron nitride nanotubes, which process comprises:
   (a) creating a source of boron vapor;
   (b) mixing the boron vapor with nitrogen gas so that a mixture of boron vapor and nitrogen gas is present at a nucleation site, the nitrogen gas being provided at a pressure elevated above 2 atmospheres and less than 250 atmospheres; and
   (c) harvesting boron nitride nanotubes, which are formed at the nucleation site.

9. The process of claim 8, wherein the pressure of the nitrogen gas is greater than 5 atmospheres and less than 250 atmospheres.

10. The process of claim 8, wherein the source of boron vapor is provided by supplying energy to a solid boron-containing target, which energy is sufficient to break bonds in the solid boron-containing target, thereby allowing boron to enter the vapor state.

11. The process of claim 10, wherein the energy supplied to the solid boron-containing target is focused thermal energy.

12. The process of claim 10, wherein the solid boron-containing target is a plug selected from the group consisting of pressed boron powder and pressed boron nitride powder.

13. The process of claim 10, wherein the energy is in the form of a laser beam, which is directed at the solid boron-containing target.

14. The process of claim 13, wherein the laser beam is allowed to drill a hole in the solid boron-containing target as the laser beam is directed thereto, thereby creating a stream of boron vapor by laser heating inside the hole.

15. The process of claim 14, wherein the stream of boron vapor is allowed to flow upwardly from the bottom of the hole and through the hole, whence it contacts the nitrogen gas, which is kept under pressure in a synthesis chamber enclosing the solid boron-containing target and containing the nitrogen gas under pressure.

16. The process of claim 15, wherein the nucleation site is the upper periphery of the hole in the solid boron-containing target, where any asperity exists.

17. The process of claim 16, wherein the boron nitride nanotubes are formed at the nucleation site and propagate away therefrom in the direction of flow of the stream of boron vapor.

18. The process of claim 17, wherein the boron nitride nanotubes are prepared at a growth rate of about 10 cm/sec.

19. The process of claim 13, wherein the laser beam emanates from a member of the group consisting of a free electron laser and a carbon dioxide laser.

20. The process of claim 8, wherein the boron nitride nanotubes are formed at the nucleation site in the absence of a catalyst.

21. The process of claim 8, wherein the nucleation site is a surface.

22. The process of claim 21, wherein the surface has an asperity.

23. The process of claim 8, wherein the nitrogen gas is provided at a pressure from greater than 2 atmospheres up to 12 atmospheres.

24. The process of claim 8, wherein the boron nitride nanotubes are crystalline nanotubes having continuous, parallel, substantially defect-free, and sp2 bonded walls, the boron nitride nanotubes being selected from the group consisting of single-walled nanotubes, double-walled nanotubes, few-walled nanotubes, and multi-walled nanotubes.

* * * * *